(12) United States Patent
Mielke

(10) Patent No.: US 6,763,507 B2
(45) Date of Patent: Jul. 13, 2004

(54) SYSTEM AND METHOD FOR TESTING ABSTRACTED TIMING MODELS

(75) Inventor: David J. Mielke, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 106 days.

(21) Appl. No.: 10/060,156

(22) Filed: Jan. 30, 2002

(65) Prior Publication Data

US 2003/0182646 A1 Sep. 25, 2003

(51) Int. Cl.[7] .............................................. G06F 17/50
(52) U.S. Cl. .................... 716/6; 716/4; 716/5
(58) Field of Search ........................ 716/4–6

(56) References Cited

U.S. PATENT DOCUMENTS

| | | | |
|---|---|---|---|
| 6,360,356 B1 * | 3/2002 | Eng ............................ | 716/18 |
| 6,438,731 B1 * | 8/2002 | Segal ............................ | 716/2 |
| 6,487,705 B1 * | 11/2002 | Roethig et al. ................ | 716/6 |
| 2003/0121013 A1 * | 6/2003 | Moon et al. .................... | 716/6 |

OTHER PUBLICATIONS

Schimpfle et al., "High–Level Circuit Modeling for Power Estimation," IEEE, 1999, pp. 807–810.*

M. R. Frerichs, "Precise Extraction of Ultra Deep Submission Interconnect Parasitic with Parameterized 3D–Modeling," IEEE, Feb. 2, 2001, pp. 50–55.*

* cited by examiner

Primary Examiner—Vuthe Siek

(57) ABSTRACT

A controller is provided that is configured to receive a timing value for a static timing model and a timing value for an extracted timing model. The controller is further configured to determine whether the timing value for the extracted timing model falls within a permissible range of deviation from the timing value for the static timing model.

19 Claims, 3 Drawing Sheets

SYSTEM AND METHOD FOR TESTING ABSTRACTED TIMING MODELS

FIELD OF THE INVENTION

The present invention is directed to a system for testing integrated circuit designs and more particualrly, to a system for determining whether the deviation between a timing value for an extracted model representation of a circuit design falls within a permissible range from a timing value for a static model of the same circuit design.

BACKGROUND

In the design of integrated circuits, static timing tools such as Prime Time® by Synopsys® are commonly used to evaluate static timing models of a circuit prior to actual fabrication of the circuit in semiconductor material. As a part of pre-fabrication evaluation of a circuit design, a timing value for a static timing model representation of the circuit is determined and subsequently a timing value for an extracted model of the same circuit is determined. These timing values are then manually evaluated to determine whether or not the timing value of the extracted model falls within a predetermined range of the timing value for the static model of the circuit.

As a typical integrated circuit design incorporates tens of thousands to millions of gates and wiring traces, the process of analyzing an integrated circuit design using these typical techniques can be very time consuming as each signal path of the circuitry must be modeled and evaluated. Further, a great deal of manual intervention is required to compare the timing values and operation of the extracted timing model with the timing value and operation of the static timing model to determine whether or not the circuit design is successful

SUMMARY OF THE INVENTION

Other features and advantages of the present invention will become apparent from the following description, drawings and claims. The present invention provides a system and method for testing abstracted timing models. Briefly described, in architecture, one embodiment of the system, among others, can be implemented as follows.

A controller is provided that is configured by software instructions stored on memory. This controller is configured to receive a static model timing value and to receive an extracted model timing value. The controller is further configured to determine the difference between the static model timing value and the extracted model timing value and then to determine whether the difference is within a predetermined permissible range. If so, the controller outputs an indication of success if said difference falls within said predetermined permissible range.

The present invention can also be viewed as providing methods for testing abstracted timing models. In this regard, one embodiment of such a method, among others, can be broadly summarized by the following steps: receiving a static model timing value. Receiving an extracted model timing value and determining the difference between the static model timing value and the extracted model timing value. A determination is made as to whether the difference is within a predetermined permissible range. If the difference does fall within the predetermined permissible range, an indication of success/qualification is output.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
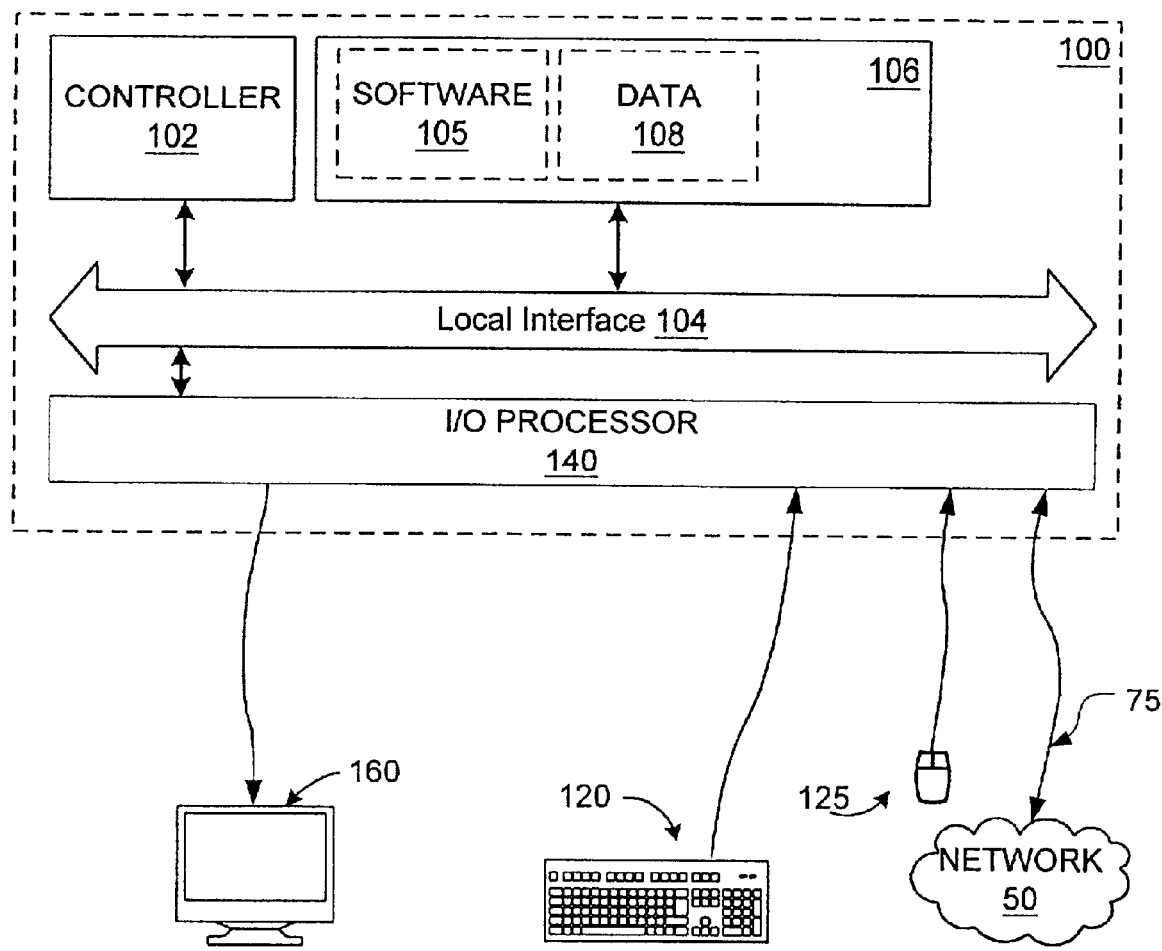
FIG. 1 is an illustration of a testing system 100 according to the invention.

The present invention provides a system and method for evaluating an integrated circuit (IC) design to determine whether or not the IC design meets predetermined criteria. More particularly, the present invention provides for evaluating an integrated circuit design to determine whether, for a given input signal, the integrated circuit design will allow the input signal to propagate through the integrated circuit within a permissible range of time. FIG. 1 shows a block diagram illustrating an example of a test system 100 for testing an integrated circuit design. Test system 100 includes a controller 102 and memory storage 106. Memory storage 106 may include memory for storing software 105 as well as data 108. Data 108 may include, among other things, a static timing model timing value, an extracted model timing value and/or an artwork database. It will be recognized that such data could also be stored on other memory associated with the test system 100 and accessible thereby via, for example, the network 50. Software 105 may include software to configure the controller 102 to carry out operations associated with the process of testing an integrated circuit design as described in, and discussed below with respect to the flowchart of FIG. 2. A local interface 104 is provided for transferring instructions and data between controller 102 and memory 106. Local interface 104 provides a conduit for transfer of electronic instructions and data from/to the input/output (I/O) processor 140. I/O processor 140 includes provisions for receiving data from, for example, a keyboard 120 and pointing device 125. I/O processor 140 also includes an interface 104 for connecting the test system 100 to a network 50, as well as outputting image data for display on a display device 160.

The software 105 (FIG. 1), comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer-readable medium can be, for example, but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium then compiled, interpreted or otherwise processed in a suitable manner, if necessary, and then stored in a computer memory.

Figure 2:
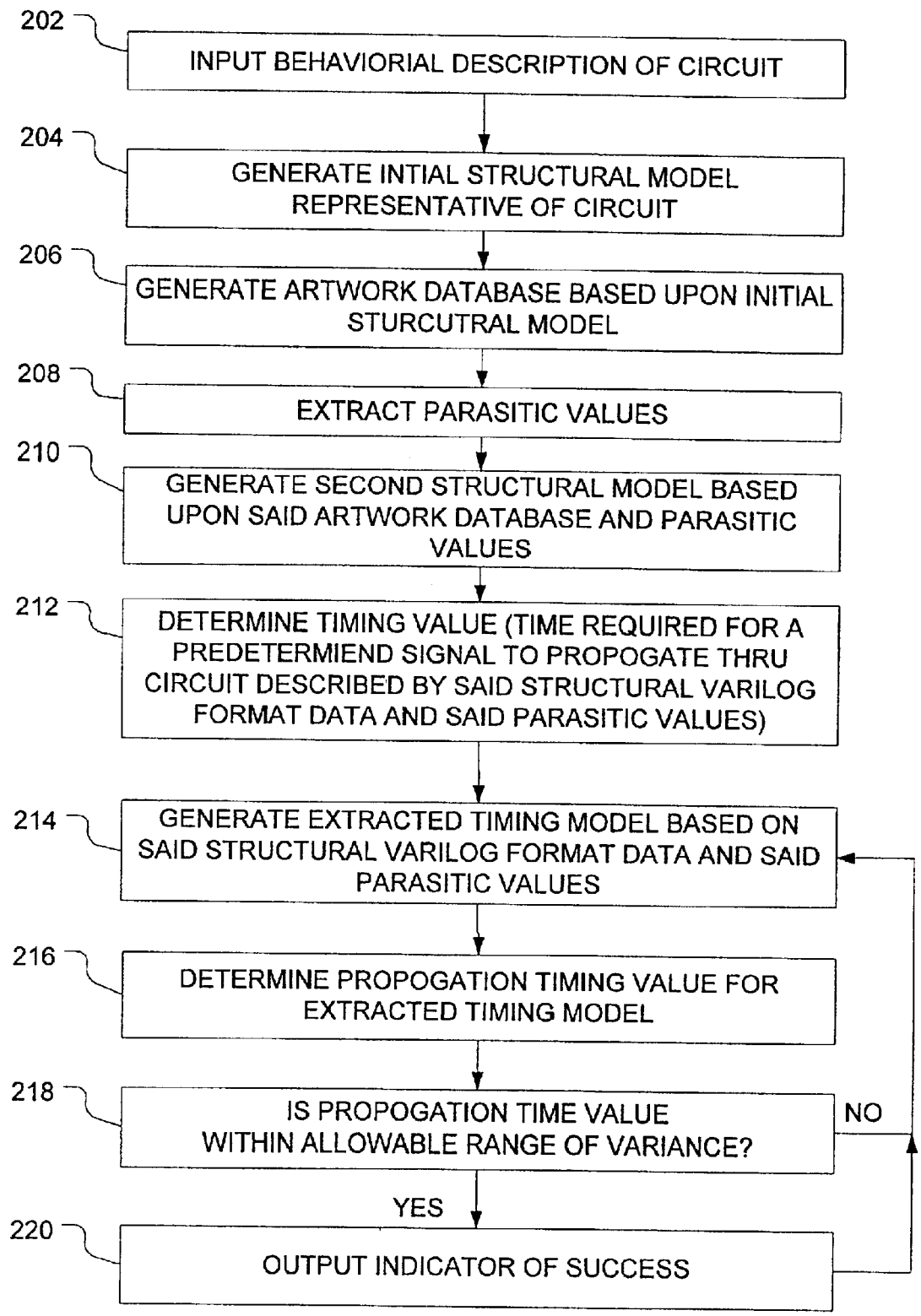
FIG. 2 is a flowchart generally describing the process of testing an integrated circuit according to the invention.

FIG. 2 is a flowchart illustrating the process of testing an integrated circuit design according to the invention. With reference to FIG. 1 and FIG. 2, a behavioral description of the circuit is input (202). This behavioral input may be made, for example, via keyboard 120 or by importing or storing data representing the behavioral description to memory 106.

In one embodiment, Verilog hardware description language (Verilog) may be utilized to create this behavioral description. Verilog is a hardware description language commonly used to design and document electronic circuits and systems. Verilog allows a designer to design to various levels of abstraction. Once the behavioral description is input, a Verilog format data file representative of the circuit is generated based on the input behavioral description (204). A Verilog format data file representative of a circuit may be generated by using, for example, a synthesis engine such as that provided by, for example, Design Compiler® by Synopsys, Inc. The synthesis engine, allows a designer to input behavioral descriptions of the circuit design that are then translated into an initial structural model representing the various gates and connective conductors comprising the circuit. This structural model may be represented in, for example, Verilog format (Verilog format data)

An artwork database is then generated based on the initial structural model (206). The initial structural model is used as the basis for creating an artwork database representative of the layout of the circuit described by the initial structural model. This artwork database represents a graphical representation of the layout of various blocks (components) and traces (connective conductors) necessary to physically implement the data path circuit via known IC fabrication techniques. The artwork database essentially describes the physical size and location of components and conductive tracing that will comprise the integrated circuit once it is fabricated using known semiconductor fabrication techniques. This artwork database may be created, for example, by using a place and route tool such as that provided by, for example, Silicon Ensemble® by Cadence Design, Inc.

Once the artwork database is created, a design rules check may be carried out to ensure that the circuit layout described by the artwork database does not violate predetermined rules and criteria for circuit layout. For example, the design rules check could be carried out to make sure that there are no signal conductors shorted to each other. The design rules check could also make sure that all signals that should be connected together are actually connected together in the artwork database.

Parasitic values are then extracted (208). Parasitic values include the resistance and capacitive values of the components and conductive tracing described by the artwork database and may be extracted from the artwork database using a commonly known parasitic extraction tool.

A second structural model is then generated (210) based upon the artwork database. This second structural model of the circuit design may be created using, for example, a known connectivity extraction tool.

The timing value for the signal path represented by the extracted parasitic values and the second structural model is determined (212). More particularly, for a given predetermined input signal, a timing value is determined that is representative of the time it takes for the given input signal to propagate through the circuit or signal path having characteristics represented by the extracted parasitic values and the second structural model. This signal timing value may be referred to as the reference timing value.

A static timing tool such as that provided by, for example, Prime Time® by Synopsys' Inc., may be used to determine a timing value for the circuit design represented by the extracted parasitic values and the second structural model derived from the artwork database.

An extracted timing model is then generated based upon the extracted parasitic values and the initial structural model (214). The extracted timing model is representative of a circuit having characteristics represented by the extracted parasitic values and the initial structural model. In the best of circumstances, this extracted timing model will be equivalent to the initial structural model in function, performance and operation when evaluated. The extracted timing model may be generated using an extracted model generator tool such as that provided by, for example, Prime Time® by Synopsys, Inc.

A signal timing value is then calculated for the extracted timing model for the same given input signal used to determine the static model signal timing value (216). This signal timing value for the extracted model is then compared with the static model signal timing value previously determined, to determine the difference between them and more particularly whether the difference falls within an allowable range (218). This determination may be made via calculations in accordance with the following:

$$X = \left(\frac{T1 - T2}{T1}\right)(100) \qquad \text{Equation 1}$$

where T1 is the reference timing value and T2 is the timing value determined for the extracted timing model.

Where it is determined that the signal timing value for the extracted model is within a predetermined percentage range of the reference timing value, for example, ±5%, the extracted model for the signal path may be said to qualify for use in the overall timing model of the IC design. It may also be said that the signal path successfully met the timing requirements. Where the extracted model models more than one signal path, as is often typical in IC design, this determination will typically be carried out for every signal path that is modeled by the extracted model. Where the signal path is found to qualify for use in the overall timing model, an indicator may be output indicating the successful qualification of the signal path (220). Such an indicator is discussed further below with respect to FIG. 3A and FIG. 3B.

Figure 3A:
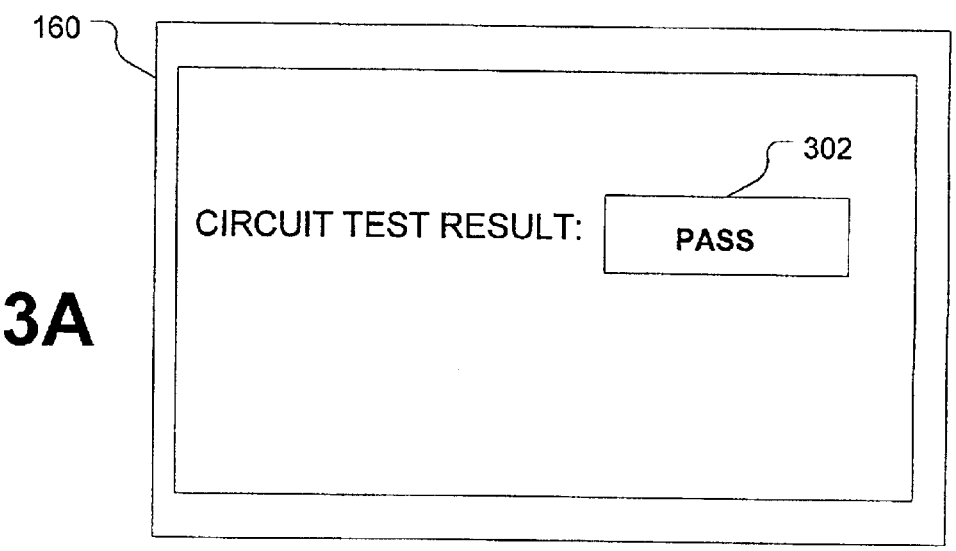
FIG. 3A is a diagram illustrating an example of an indicator 302 displayed on a display device 160.
Figure 3B:
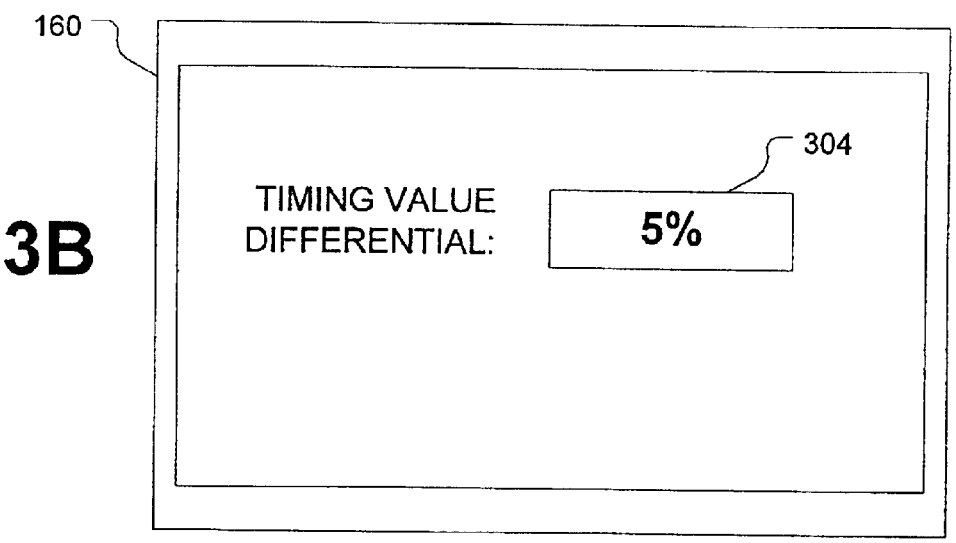
FIG. 3B is a diagram illustrating an example of an indicator 304 displayed on a display device 160.

With reference to FIG. 3A and FIG. 3B, in one embodiment of the invention, the system of the present invention is configured to generate and output an indicator 302, such as "PASS", for display on a display device 160. Alternatively, the system may be configured to generate and output an indicator 304 representative of the actual percentage differential for display on a display device 160. For example, where the difference between the timing value for the extracted model is within ±5% of the timing value for the reference timing value, the system may be configured to output an indicator such as "5%" for display on an associated display device to thereby indicate the percentage by which the timing value for the extracted model varies from the reference timing value. If the indicator shows a percentage that is outside the permissible range of deviation, the designer/user will recognize that the signal path did not pass the evaluation and that rework of the design may be required. On the other hand, if the indicator shows a percentage that is within the permissible range of deviation, the designer/user will recognize that the signal path did qualify. In which case, the process of evaluating other circuits may proceed if necessary. Alternatively, the indicator may be output for printing to a print media such as paper.

The flow chart of FIG. 2 shows the architecture, functionality, and operation of a possible implementation of software that causes the process of collection and distribution of calendar information to be carried out In this regard, each block represents a module, segment, or portion of code, which comprises one or more executable instructions for implementing the specified logical function(s). It should also be noted that in some alternative implementations, the functions noted in the blocks may occur out of the order noted in FIG. 2. For example, two blocks shown in succession in FIG. 2 may in fact be executed substantially concurrently or the blocks may sometimes be executed in the reverse order, depending upon the functionality involved, as will be further clarified hereinbelow.

It should be noted that the present invention has been discussed with reference to preferred and example embodiments. The present invention is not intended to be limited to these embodiments. For example, the present invention is not limited to the processing conditions discussed above. The processing conditions described herein are merely for purposes of demonstration of particular implementations as well as for the purpose of demonstrating that a variety of processing conditions are suitable for achieving the goals of the present invention. Those skilled in the art will understand, in view of the discussion provided herein that many modifications may be made to the embodiments specifically described herein without deviating from the scope of the present invention.

What is claimed is:

1. A system for testing an abstracted timing model representative of an integrated circuit design comprising:
    a controller;
    memory associated with said controller for storing electronic format instructions;
    said controller is configured to:
        receive a reference timing value representative of a time required for a signal to propagate through a path represented by a first model of a circuit;
        receive an extracted model timing value representative of a time required for a signal to propagate through a path represented by a second model of the circuit, wherein the second model is an abstraction of the first model;
        determine a difference between said reference timing value and said extracted model timing value;
        determine whether said difference is within a predetermined permissible range; and
        output an indication of success if said difference falls within said predetermined permissible range.

2. The system of claim 1, wherein said memory is further configured to store data representing said predetermined permissible range.

3. The system of claim 1, wherein said controller is configured in accordance with said electronic format instructions stored on said memory.

4. The system of claim 1, wherein said controller is further configured to generate the first model.

5. The system of claim 1, wherein said controller is further configured to generate said reference timing value.

6. The system of claim 5, wherein said controller is further configured to generate said extracted model timing value.

7. The system of claim 1, wherein said controller is further configured to generate said second model.

8. A method of testing an abstracted timing model, comprising the steps of:
    receiving a reference timing value representative of a time required for a signal to propagate through a path represented by a first model of a circuit;
    receiving an extracted model timing value representative of a time required for a signal to propagate through a path represented by a second model of the circuit, wherein the second model is an abstraction of the first model;
    determining a difference between said reference timing value and said extracted model timing value;
    determining whether said difference is within a predetermined permissible range; and
    outputting an indication of success if said difference falls within said predetermined permissible range.

9. The method of claim 8, further comprising the step of generating said first model.

10. The method of claim 8, further comprising the step of generating said second model.

11. A computer program for testing an abstracted timing model, the computer program comprising:
    a first code segment for receiving a reference timing value representative of a time required for a signal to propagate through a path represented by a first model of a circuit;
    a second code segment for receiving an extracted model timing value representative of a time required for a signal to propagate through a path represented by a second model of the circuit, wherein the second model is an abstraction of the first model;
    a third code segment for determining a difference between said reference timing value and said extracted model timing value; and
    a fourth code segment for outputting an indication of success if said difference falls within a predetermined permissible range.

12. A computer program according to claim 11, further comprising a sixth code segment for generating said first model.

13. A computer program according to claim 11, further comprising a sixth code segment for generating said second model.

14. A method for testing an abstracted timing model, comprising the steps of:
    comparing a first value that is responsive to a time required for a signal to propagate through a path represented by a first model of a circuit with a second value that is responsive to a time required for a signal to propagate through a path represented by a second model of the circuit, wherein the second model is an abstraction of the first model; and outputting a result of the step of comparing the first value and the second value.

15. The method of claim 14, wherein the result identifies a difference between the first and second values.

16. The method of claim 14, wherein the result indicates whether a difference between the first and second values exceeds a pre-determined threshold.

17. A system for testing an abstracted timing model, comprising:

means for comparing a first value that is responsive to a time required for a signal to propagate through a path represented by a first model of a circuit with a second value that is responsive to a time required for a signal to propagate through a path represented by a second model of the circuit, wherein the second model is an abstraction of the first model; and means for outputting a result of the step of comparing the first value and the second value.

18. The system of claim 17, wherein the result identifies a difference between the first and second values.

19. The system of claim 17, wherein the result indicates whether a difference between the first and second values exceeds a pre-determined threshold.

* * * * *